United States Patent
Song et al.

(10) Patent No.: US 11,245,345 B2
(45) Date of Patent: Feb. 8, 2022

(54) SELF-RESONANCE TUNING PIEZOELECTRIC ENERGY HARVESTER WITH BROADBAND OPERATION FREQUENCY

(71) Applicant: KOREA INSTITUTE OF SCIENCE AND TECHNOLOGY, Seoul (KR)

(72) Inventors: Hyun-Cheol Song, Seoul (KR); Chong Yun Kang, Seoul (KR); Jin Sang Kim, Seoul (KR); Ji-won Choi, Seoul (KR); Seung Hyub Baek, Seoul (KR); Seong Keun Kim, Seoul (KR); Sang Tae Kim, Seoul (KR); Youn-hwan Shin, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 515 days.

(21) Appl. No.: 16/296,218

(22) Filed: Mar. 8, 2019

(65) Prior Publication Data

US 2020/0076331 A1 Mar. 5, 2020

(30) Foreign Application Priority Data

Aug. 29, 2018 (KR) ........................ 10-2018-0101978

(51) Int. Cl.
*H02N 2/18* (2006.01)
*H01L 41/04* (2006.01)
(Continued)

(52) U.S. Cl.
CPC ............. *H02N 2/188* (2013.01); *H01L 41/04* (2013.01); *H01L 41/053* (2013.01); *H01L 41/1134* (2013.01)

(58) Field of Classification Search
CPC ....... H02N 2/188; H01L 41/04; H01L 41/053; H01L 41/134
See application file for complete search history.

(56) References Cited

U.S. PATENT DOCUMENTS 7,626,316 B2 * 12/2009 Kozinsky ............ H01L 41/1134
310/319
7,777,396 B2 8/2010 Rastegar et al.
(Continued)

FOREIGN PATENT DOCUMENTS

CN 108039835 A * 5/2018
CN 112260583 A * 1/2021
(Continued)

OTHER PUBLICATIONS

Lihua Tang et al., "Broadband Vibration Energy Harvesting Techniques," Advances in Energy Harvesting Methods, 2013, pp. 17-61.
(Continued)

*Primary Examiner* — J. San Martin
(74) *Attorney, Agent, or Firm* — Cantor Colburn LLP

(57) ABSTRACT

Provided is a self-resonance tuning piezoelectric energy harvester. The self-resonance tuning piezoelectric energy harvester includes a piezoelectric beam which extends along a horizontal direction, a fixing element which fixes two ends of the piezoelectric beam, and a mass which is connected to the piezoelectric beam movably along the piezoelectric beam, wherein the mass includes a through-hole through which the piezoelectric beam passes, and makes the movement through the through-hole. According to the principle of continuous movement to the resonance position, the mass of the self-resonance tuning piezoelectric energy harvester induces the piezoelectric beam to generate displacement to the maximum and maximize the electricity production capacity of the piezoelectric energy harvester.

7 Claims, 9 Drawing Sheets

(51) Int. Cl.
   *H01L 41/113*   (2006.01)
   *H01L 41/053*   (2006.01)

(56)     References Cited

U.S. PATENT DOCUMENTS

| | | | | |
|---|---|---|---|---|
| 8,866,316 B2* | 10/2014 | Wood | ................... | H02N 2/188 |
| | | | | 290/1 R |
| 2009/0085442 A1* | 4/2009 | Kozinsky | ............... | H02N 2/188 |
| | | | | 310/339 |
| 2009/0195222 A1* | 8/2009 | Lu | .......................... | H02N 2/188 |
| | | | | 322/3 |
| 2021/0159388 A1* | 5/2021 | Liao | ...................... | H02N 2/181 |

FOREIGN PATENT DOCUMENTS

| | | | |
|---|---|---|---|
| KR | 101190451 B1 | 10/2012 | |
| KR | 101301695 B1 | 8/2013 | |
| KR | 1020140112006 A | 9/2014 | |
| KR | 101501389 B1 | 3/2015 | |
| KR | 1020170006116 A | 1/2017 | |
| WO | 2013062406 A1 | 5/2013 | |

OTHER PUBLICATIONS

Ahmed Emad et al., "Testing and evaluation of stretching strain in clamped-clamped beams for energy harvesting", Smart Materials and Structures, Oct. 4, 2016, 9 pages, vol. 25, No. 115006, IOP Publishing Ltd.

* cited by examiner

SELF-RESONANCE TUNING PIEZOELECTRIC ENERGY HARVESTER WITH BROADBAND OPERATION FREQUENCY

DESCRIPTION OF GOVERNMENT-SPONSORED RESEARCH AND DEVELOPMENT

This research is made in line with the industrial technology innovation project (energy technology development project) "research of energy harvesting material and model development for independent power of smart sensor" (project serial number: 20182010106361) in Ministry of Trade, Industry and Energy under the supervision of Korea Institute of Energy Technology Evaluation and Planning.

This research is made in line with the creative fusion research project "research of piezoelectric/electrostatic/electrochemical hybrid energy harvesting material and device development" (project serial number: CAP-17-04-KRISS) in Ministry of Science and ICT under the supervision of National Research Council of Science & Technology.

CROSS-REFERENCE TO RELATED APPLICATION

This application claims priority to Korean Patent Application No. 10-2018-0101978, filed on Aug. 29, 2018, and all the benefits accruing therefrom under 35 U.S.C. § 119, the contents of which in its entirety are herein incorporated by reference.

BACKGROUND

1. Field

The present disclosure relates to a resonant piezoelectric energy harvester with a broadband operation frequency range. More particularly, the present disclosure relates to a piezoelectric energy harvester in which a mass having a gap moves by itself so that the frequency of external vibration matches the natural frequency of the device without additional energy supply to the device or a change in a piezoelectric structure, to continuously maintain a resonance phenomenon even in environments in which the frequency of vibration changes.

2. Description of the Related Art

The domestic power demand increases every year and threatens blackout in summer and winter at which power consumption increases rapidly, and to secure the stable supply of future energy resources and respond to the growing demand for power, efforts are made all over the world. Additionally, there is a trend towards the explosively increasing interest in new renewable energy, and particularly, development of energy harvesting technology that converts sunlight, wind, waves, heat and motion energy to electrical energy is being accelerated.

Among many energy harvesting technologies, a piezoelectric energy harvester is a device that converts mechanical energy to electrical energy by inducing the physical strain of a piezoelectric material from the outside environment, and it is a type of energy generator that can use energy that is wasted such as impact, pressure, vibration, etc. as electrical energy.

In the case of a piezoelectric energy harvester using vibration, it is necessary to design the structure such that the natural frequency of the device matches the resonance frequency at which displacement becomes a maximum. However, when the resonance frequency is outside of the fixed natural frequency of the device, displacement significantly reduces and piezoelectric output significantly reduces. Accordingly, a method that changes the natural frequency using the nonlinear resonant characteristics of a structure, or by adjusting the size of an actuator or a structure has been used, but displacement significantly reduces in frequency ranges other than the resonance frequency and additional external supply is necessary, so it is not efficient in terms of energy.

SUMMARY

The present disclosure is designed to solve the problems such as those described above, and therefore the present disclosure is directed to providing a self-resonance tuning piezoelectric energy harvester in which when the changing external vibration is applied, a mobile mass moves by itself to a position of a piezoelectric beam at which resonance occurs. Because the mobile mass moves by itself to the position of the piezoelectric beam at which resonance occurs, the present disclosure has a wide operation frequency bandwidth, and may continuously maintain resonance and maximize the piezoelectric output efficiency without additional supply.

A self-resonance tuning piezoelectric energy harvester according to an embodiment of the present disclosure includes a piezoelectric beam which extends along a horizontal direction, a fixing element which fixes two ends of the piezoelectric beam, and a mass which is connected to the piezoelectric beam movably along the piezoelectric beam, wherein the mass includes a through-hole through which the piezoelectric beam passes, and makes the movement through the through-hole.

In an embodiment, the mass may differ in resonance frequency depending on a position at which the mass is connected to the piezoelectric beam, and the mass may move to a position of the piezoelectric beam at which resonance will occur with an input frequency provided to the piezoelectric beam.

In an embodiment, the through-hole may further include a clearance in addition to a space through which the piezoelectric beam passes.

In an embodiment, as the mass moves to the position of the piezoelectric beam at which resonance will occur, displacement of the piezoelectric beam may increases, and as the displacement is greater than the clearance, the mass may be fixed to the position of the piezoelectric beam at which resonance will occur.

In an embodiment, output characteristic measured in the piezoelectric beam over time may appear in a form of a sine wave, and the sine wave may include an inflection point at a point where a positive output is maximum.

In an embodiment, the piezoelectric beam may include a substrate, and a piezoelectric energy harvester unit element which receives a bending moment from the substrate, and the piezoelectric energy harvester unit element may include a first electrode, a piezoelectric material disposed on the first electrode, and a second electrode disposed on the piezoelectric material.

In an embodiment, the piezoelectric material may include a piezoelectric single crystal of one selected from the group consisting of PZT, $Pb(Zn_{1/3}Nb_{2/3})O_3$—$PbTiO_3$ (PZN-PT),

[Pb(Mg$_{1/3}$Nb$_{2/3}$)O$_3$]—[PbTiO$_3$] (PMN-PT), (Na$_x$K$_{1-x}$)NbO$_3$ (NKN), BaTiO$_3$, ZnO, CdS and AlN, a piezoelectric mixture of at least one material selected from the group, including Macrofiber composite (MFC) and 2-2 composite, or a polymer piezoelectric material, including PVDF and PVDF-TrFE.

The piezoelectric energy harvester according to an embodiment of the present disclosure has a simple structure because it includes a piezoelectric beam and a mass, and the mass may move to and be fixed to a position on the piezoelectric beam at which resonance occurs in response to external vibration. Accordingly, the piezoelectric beam of the present disclosure may efficiently produce electrical energy in a wide frequency range while minimizing a user's interference.

The piezoelectric energy harvester according to an embodiment of the present disclosure may be utilized in any environment in which changing vibration is applied, and may be used as a power source of a low-power sensor for implementing a smart factory in the future.

DETAILED DESCRIPTION

Figure 1:
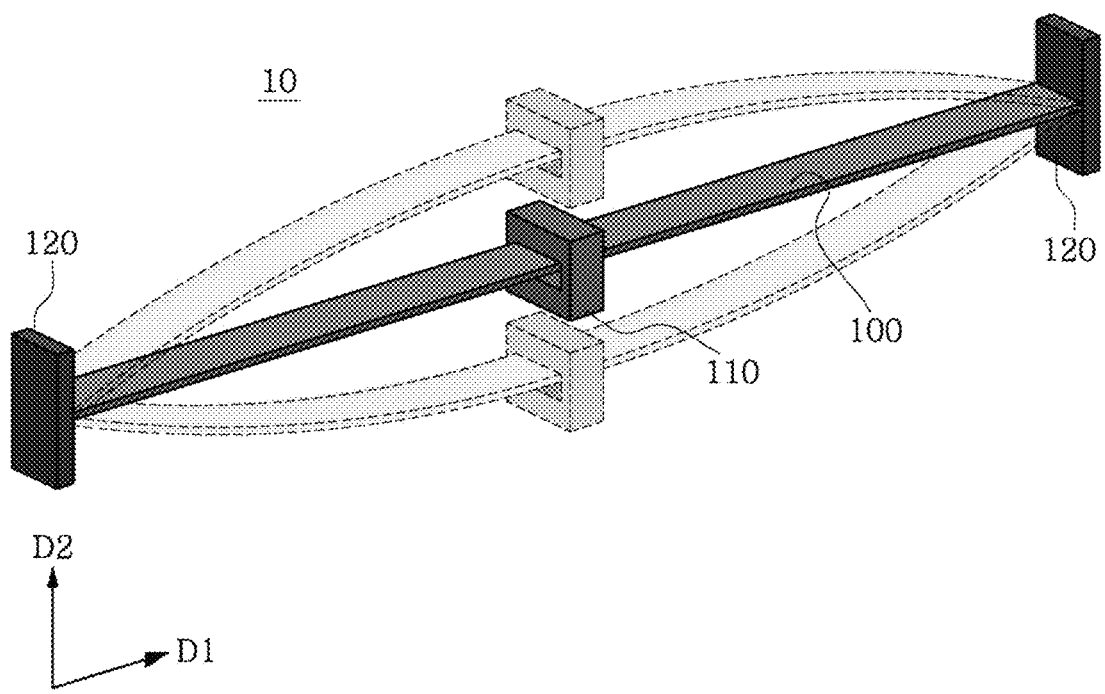
FIG. 1 is a schematic diagram of a piezoelectric energy harvester according to an embodiment of the present disclosure.

The following detailed description of the present disclosure is made with reference to the accompanying drawings, in which particular embodiments for practicing the present disclosure are shown for illustration purposes. These embodiments are described in sufficiently detail for those skilled in the art to practice the present disclosure. It should be understood that various embodiments of the present disclosure are different but do not need to be mutually exclusive. For example, particular shapes, structures and features described herein in connection with one embodiment can be embodied in other embodiment without departing from the spirit and scope of the present disclosure. It should be further understood that changes can be made to locations or arrangements of individual elements in each disclosed embodiment without departing from the spirit and scope of the present disclosure. Accordingly, the following detailed description is not intended to be taken in limiting senses, and the scope of the present disclosure is only defined by the appended claims along with the full scope of equivalents to which such claims are entitled. In the drawings, similar reference signs denote same or similar functions in many aspects.

The terms as used herein are general terms selected as those being now used as widely as possible in consideration of functions, but they may change depending on the intention of those skilled in the art or the convention or the emergence of new technology. Additionally, in certain cases, there may be terms arbitrarily selected by the applicant, and in this case, the meaning will be described in the corresponding description part of the specification. Accordingly, it should be noted that the terms as used herein should be interpreted based on the substantial meaning of the terms and the context throughout the specification, rather than simply the name of the terms.

Figure 2:
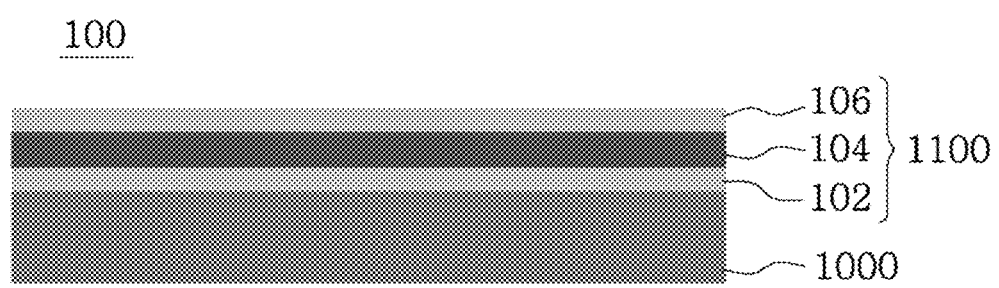
FIG. 2 is a schematic diagram showing the structure of a piezoelectric beam according to an embodiment of the present disclosure.

FIG. 1 is a schematic diagram of a piezoelectric energy harvester according to an embodiment of the present disclosure. FIG. 2 is a schematic diagram showing the structure of a piezoelectric beam according to an embodiment of the present disclosure.

Referring to FIGS. 1 and 2, the piezoelectric energy harvester 10 includes a piezoelectric beam 100, a mass 110 and a fixing element 120.

The piezoelectric beam 100 may extend along a first direction D1. Here, the first direction refers to a horizontal direction. Two ends of the piezoelectric beam 100 may be fixed by the fixing element 120. The piezoelectric beam 100 may vibrate in a second direction D2 perpendicular to the first direction with the two ends being fixed. The second direction may be a direction perpendicular to the extension direction of the piezoelectric beam 100, and the piezoelectric beam 100 may vibrate up and down as shown in FIG. 1. The piezoelectric beam 100 may generate voltage by the vibration.

The piezoelectric beam 100 includes a substrate 1000 and a piezoelectric energy harvester unit element 1100. The piezoelectric energy harvester unit element 1100 may be disposed on the substrate 1000. In some embodiments, a plurality of piezoelectric energy harvester unit elements may be provided. At least one piezoelectric energy harvester unit element 1100 may include a first piezoelectric energy harvester unit element and a second piezoelectric energy harvester unit element symmetrically disposed with regard to the substrate 1000. However, the present disclosure is not limited thereto, and the plurality of piezoelectric energy harvester unit elements 1100 may be disposed on the substrate 1000 in a sequential order, and may be implemented in various forms according to usage environments and design purposes.

The substrate 1000 may be made of a metal, and may be connected to the fixing element 120. The substrate 1000 may be a cantilever that has a high aspect ratio and is suitable for vibration environment. The substrate 1000 may bend at a predefined curvature, and may distribute a physical force to the piezoelectric energy harvester unit element 1100 and provide an ability to restore to its initial state. A voltage may be induced in the piezoelectric energy harvester unit element 1100 with a change in position of the substrate 1000.

The piezoelectric energy harvester unit element 1100 may be disposed on the substrate 1000 and receive a bending moment from the substrate 1000. The harvester unit element 1100 may include a first electrode 102, a piezoelectric material 104 and a second electrode 106. The first electrode 102, the piezoelectric material 104, the second electrode 106 may have a sequential stack structure, and the first electrode 102 may be disposed on the substrate 1000.

The first electrode 102 may be a piezoelectric electrode that transmits piezoelectric energy to the outside when the piezoelectric material 104 generates the piezoelectric energy, and may include a conductor having high electrical conductivity. The second electrode 106 may be disposed on the piezoelectric material 104, and the second electrode 106 may be a piezoelectric electrode that transmits piezoelectric energy to the outside when the piezoelectric material 104 generates the piezoelectric energy, and may include a conductor having high electrical conductivity.

The piezoelectric material 104 may include a material that generates voltage from an external force based on the piezoelectric effect. The mechanical distortion by the stress transmitted to the piezoelectric material 104 causes dielectric polarization in the material, generating a potential difference across the piezoelectric material 104. The first electrode 102 and the second electrode 106 disposed on and under the piezoelectric material 104 may have a potential difference, and a corresponding magnitude of voltage may be generated.

The piezoelectric material 104 may include a piezoelectric single crystal of one selected from the group consisting of PZT, $Pb(Zn_{1/3}Nb_{2/3})O_3$—$PbTiO_3$ (PZN-PT), $[Pb(Mg_{1/3}Nb_{2/3})O_3]$—$[PbTiO_3]$ (PMN-PT), $(Na_xK_{1-x})NbO_3$ (NKN), $BaTiO_3$, ZnO, CdS and AlN. Alternatively, the piezoelectric material 104 may include a piezoelectric mixture of at least material selected from the above-described group, such as Macrofiber composite (MFC) and 2-2 composite. In another embodiment, the piezoelectric material 104 may be a polymer piezoelectric material such as PVDF and PVDF-TrFE.

The piezoelectric material 104 may be formed of various types such as a thin-film type polymer based film structure and a mixture of a nano/micro structure material and a polymer, but is not limited thereto. In this embodiment, when considering that the piezoelectric beam 100 generates a large displacement by the resonance frequency, the piezoelectric material 104 may be formed with a PVDF polymer based film structure that has a good mechanical strength and is soft and flexible.

The piezoelectric energy harvester 10 may further include a vibration generation element (not shown) to provide vibration to the substrate 1000 at a predefined input frequency, an energy storage circuit (not shown) to rectify and accumulate voltage generated by the piezoelectric energy harvester unit element 1100, and a housing (not shown) to receive each component of the piezoelectric energy harvester 10.

The mass 110 is connected to the piezoelectric beam 100 movably along the piezoelectric beam 100. The mass 110 may be made of a metal having a higher density than the substrate 1000, and may extend the maximum strain of the piezoelectric beam 100 to increase an amount of electricity generated from the piezoelectric energy harvester 10. The piezoelectric energy harvester 10 may be provided with an input frequency from the outside, and the piezoelectric beam 100 may resonate by the input frequency. The mass 110, which is connected to the piezoelectric beam 100, may resonate with the input frequency provided from the outside, and when the mass 110 resonates with the external input frequency, displacement of the piezoelectric beam 100 may be extended more and a larger amount of voltage may be generated. However, the mass 110 may differ in frequency at which resonance will occur depending on a position at which the mass 110 is connected to the piezoelectric beam 100.

Figure 3:
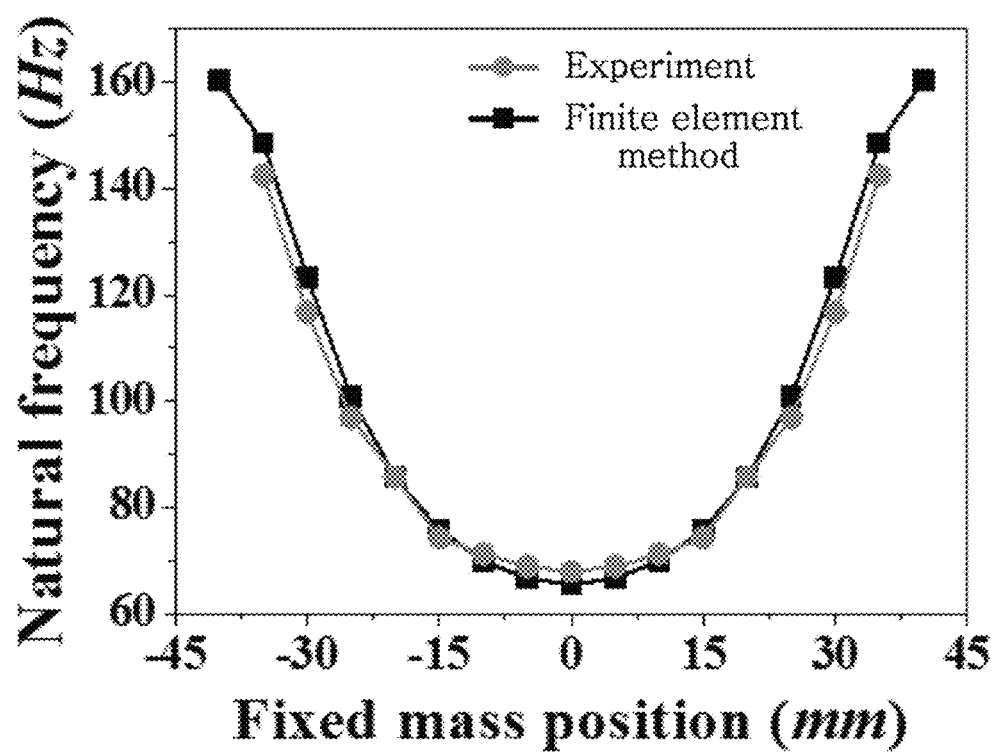
FIG. 3 is a graph showing resonance frequency characteristics with a change in position of a mass in the piezoelectric beam of FIG. 1.

FIG. 3 is a graph showing resonance frequency characteristics with a change in position of the mass in the piezoelectric beam of FIG. 1. When an imaginary line dividing the piezoelectric beam 100 into two in the second direction is defined as the center of the piezoelectric beam, as the center of the piezoelectric beam faces away from the fixing element 120, the resonance frequency of the mass 110 may increase. According to the theory of mechanical vibration, the resonance frequency relies on the mass and the spring constant of a vibration system. The mass of the entire structure is constant, while the farther away from the center of the piezoelectric beam, the higher the spring constant, and the higher the resonance frequency at which the mass 110 resonates. This feature is equally found in data measured according to the experiment and data calculated by the finite element method as shown in FIG. 3. It can be seen that as it is far away leftward and rightward from the center of the piezoelectric beam, the resonance frequency increases, and this is measured and calculated in a symmetrical shape.

Here, the mass 110 according to this embodiment may move by itself to a position of the piezoelectric beam 100 at which resonance will occur with the input frequency provided from the outside, and may be fixed to the position at which resonance occurs, inducing vibration of the piezoelectric beam 100 to generate a large amount of voltage. The mass 110 may move in the left or right direction relative to the center of the piezoelectric beam 100. The mass 110 may include a through-hole H through which the piezoelectric beam 100 passes, and may move the position through the through-hole H. The piezoelectric energy harvester 10 according to an embodiment of the present disclosure may be a self-resonance tuning piezoelectric energy harvester that enables self-resonance tuning by the position movement of the mass 110.

Figure 4:
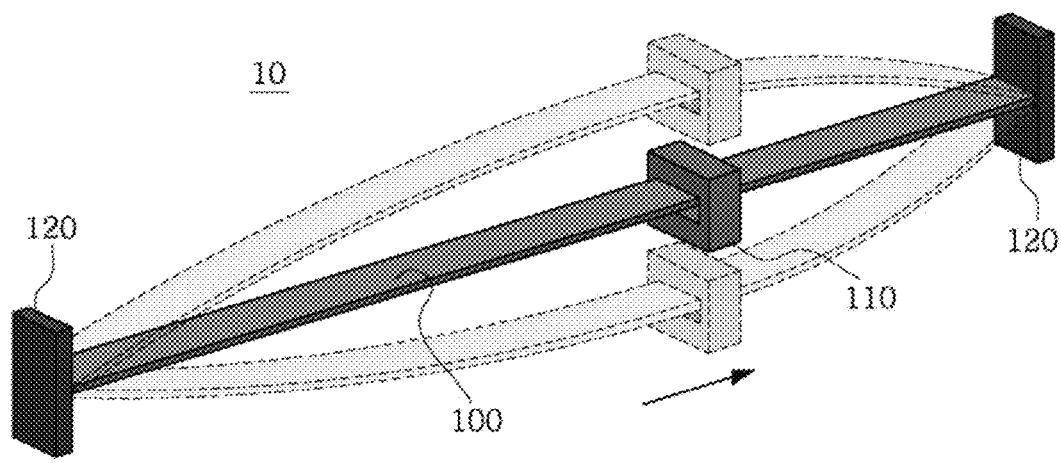
FIG. 4 is a cross-sectional view of a mass according to an embodiment of the present disclosure.
Figure 5:
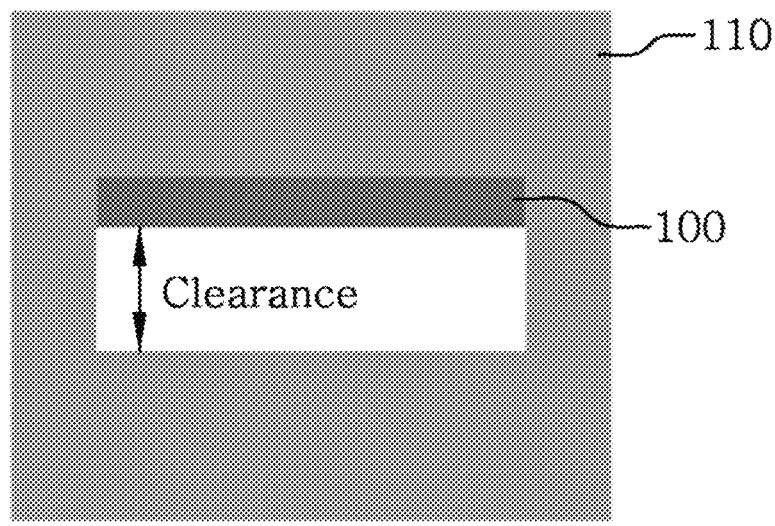
FIG. 5 is a schematic diagram showing a piezoelectric energy harvester with a horizontally moved mass.
Figure 6:
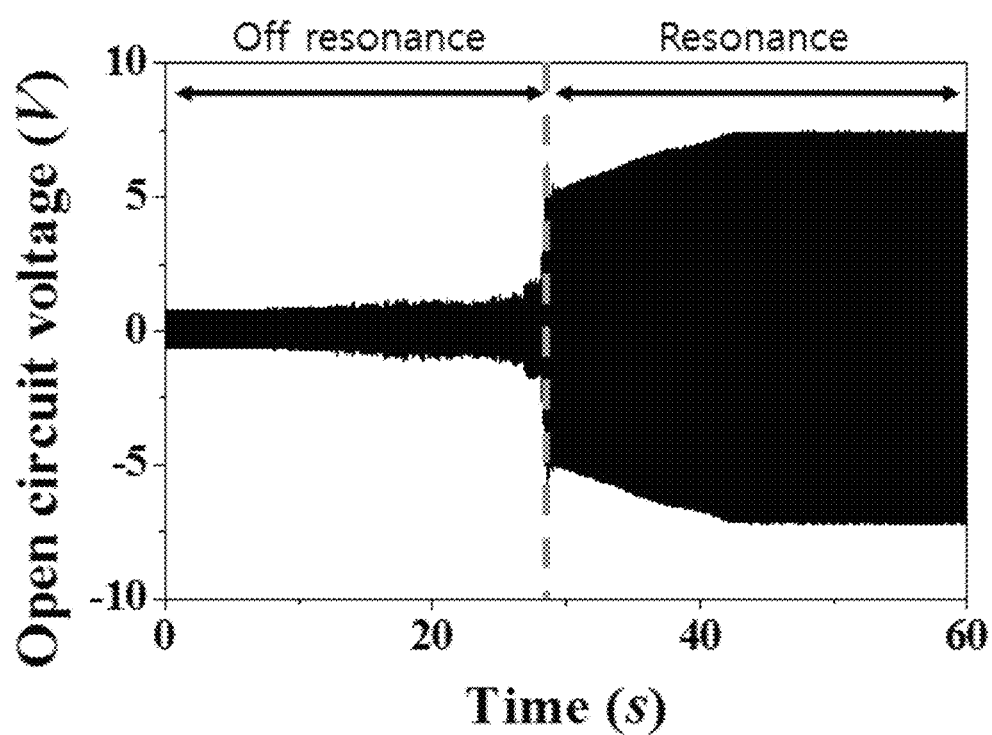
FIG. 6 is a graph showing output characteristics of a piezoelectric beam over time.

FIG. 4 is a cross-sectional view of the mass according to an embodiment of the present disclosure, FIG. 5 is a schematic diagram showing the piezoelectric energy harvester with the horizontally moved mass, and FIG. 6 is a graph showing output characteristics of the piezoelectric beam over time.

In a situation in which no input frequency is provided from the outside of the piezoelectric beam 100, the mass 110 is not fixed to the piezoelectric beam 100. When the input frequency is provided from the outside and vibration occurs in the piezoelectric beam 100, the position at which the mass 110 is connected to the piezoelectric beam 100 may be moved, and the movement range of the mass 110 may be limited to the extension length of the piezoelectric beam 100 and the space defined by the fixing element 120.

The mass 110 may include the through-hole H, and may be connected to the piezoelectric beam 100 through the through-hole H. In addition to the space through which the piezoelectric beam 100 passes, the through-hole H may include a clearance. The mass 110 and the piezoelectric beam 100 may be connected with a gap between, and the mass 110, which is connected to the piezoelectric beam 100, may move along the piezoelectric beam 100 through the gap corresponding to the clearance. The vertical height of the through-hole H may be higher than the vertical thickness of the piezoelectric beam 100. The length of the through-hole H along the second direction may be longer than the length of the piezoelectric beam 100 along the second direction. For example, the vertical height of the through-hole H may be about three times greater than the vertical thickness of the piezoelectric beam 100, but is not limited thereto. The mass 110 may move along the extension direction of the piezoelectric beam 100 while maintaining the connection with the piezoelectric beam 100 through the clearance of the through-hole H, leading to a change in the contact position with the piezoelectric beam 100. Hereinafter, the movement of the mass 110 will be described in more detail together with the output characteristics of the piezoelectric energy harvester of the present disclosure.

FIG. 6 is a graph showing output characteristics of voltage over time after providing a predetermined magnitude of input frequency to the piezoelectric energy harvester 10 according to this embodiment. The mass 110 may be disposed at the center of the piezoelectric beam 100 at the initial time when the input frequency is provided, and may move to a resonance area of the piezoelectric beam 100 that matches an external vibration source. When a predetermined magnitude of input frequency is provided to the piezoelectric energy harvester 10, the piezoelectric beam 100 may vibrate in the same form as the primary resonance which is a sine wave, and this displacement may be smaller than the clearance of the through-hole H of the mass 110. That is, displacement generated until the mass 110 moves to the position of the piezoelectric beam 100 at which resonance occurs may be smaller than the clearance of the through-hole H of the mass 110, and the mass 110 which is connected to the piezoelectric beam 100 may move along the piezoelectric beam 100. In a situation in which vibration occurs in part, the movement of the mass 110 may be easier.

However, as the mass 110 moves toward the position of the piezoelectric beam 100 at which resonance will occur, the displacement of the piezoelectric beam 100 increases, and this displacement may be greater than the clearance of the through-hole H of the mass 110. In the graph of FIG. 6, it can be seen that the measured resonance occurred after about 28 sec has elapsed, but there is a significant increase compared with the non-resonance state of the outputted voltage.

By the displacement of the piezoelectric beam 100 increasing with the movement of the mass 110 to the position of the piezoelectric beam 100 at which resonance occurs, the mass 110 may be fixed to the position of the piezoelectric beam 100 at which resonance occurs. The mass 110 having moved to the position of the piezoelectric beam 100, at which resonance will occur, is fixed to the position at which resonance will occur and the displacement of the piezoelectric beam 100 is extended, and thus the piezoelectric energy harvester 10 may continuously generate a high output of voltage. In the graph of FIG. 6, it can be seen that voltage generated after about 41 sec has elapsed is outputted to maximum and the maximum output voltage is continuously maintained. Additionally, in the graph of FIG. 6, it can be seen that the maximum output voltage is 1.2 V at non-resonance and 8.1 V at resonance, and thus there is a significant increase in output voltage due to the extended displacement.

Figure 7A:
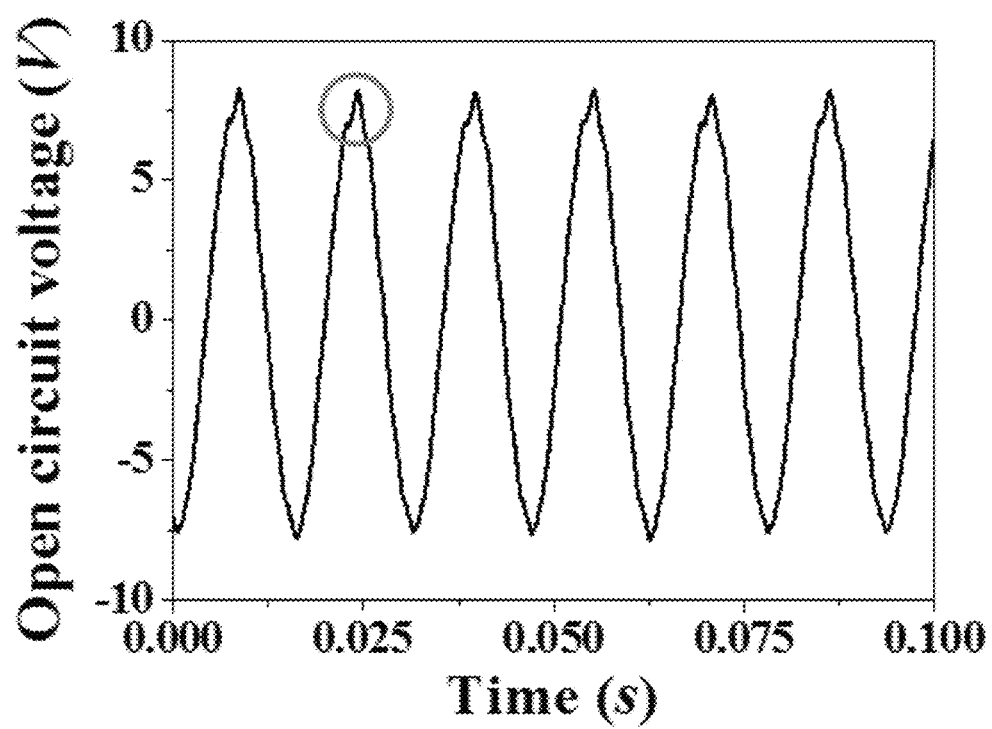
FIG. 7A is an enlarged graph showing output characteristics of a piezoelectric energy harvester according to this embodiment.
Figure 7B:
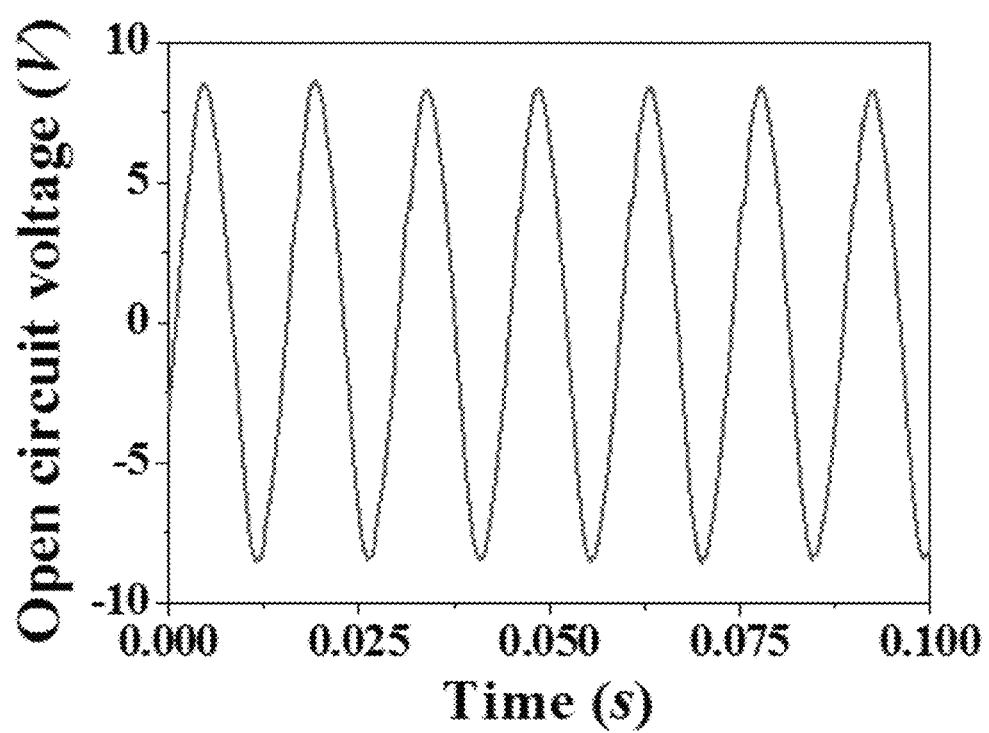
FIG. 7B is an enlarged graph showing output characteristics of a piezoelectric energy harvester of a conventional structure.

FIG. 7A is an enlarged graph showing output characteristics of the piezoelectric energy harvester according to this embodiment, and FIG. 7B is an enlarged graph showing output characteristics of a piezoelectric energy harvester of a conventional structure.

It can be seen that the output of the piezoelectric energy harvester over time and the output characteristics measured in the piezoelectric beam over time appear in the form of a sine wave, and resonance of the piezoelectric beam 100 is generated in a primary mode. Because the through-hole H of the mass 110 of the piezoelectric energy harvester according to this embodiment includes the area through which the piezoelectric beam 100 passes but also the clearance, i.e., the gap, an inflection point (indicated by a circle in the graph of FIG. 7A) at a point where the positive output of the sine wave is maximum. This is not seen in the output characteristics of the piezoelectric energy harvester of the conventional structure.

As described above, the resonance frequency at which the mass 110 resonates may differ depending on the position of the connected piezoelectric beam 100, and the input frequency provided to the piezoelectric beam 100 may differ depending on the space and environment in which the piezoelectric energy harvester 10 is disposed. However, the piezoelectric energy harvester 10 according to this embodiment includes the mass 110 that may move by itself to the position of the piezoelectric beam 100 at which resonance occurs with the input frequency provided from the outside, and keep staying at the corresponding position, inducing the generation of high output voltage. That is, as the mass 110 moves to the position at which resonance will occur at the input frequency provided from the outside and the displacement is extended, the piezoelectric energy harvester 10 according to this embodiment may provide high output in a wider input frequency range than the conventional structure with the mass being fixed.

Figure 8:
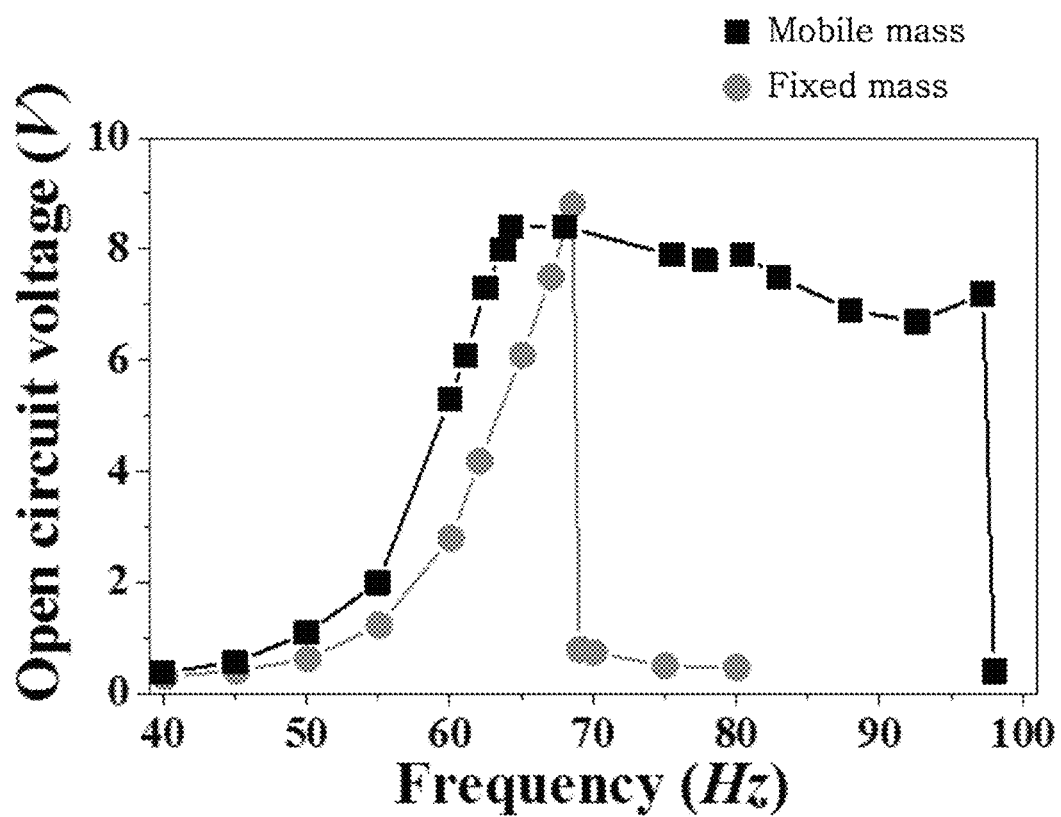
FIG. 8 is a graph showing a comparison of maximum output characteristics as a function of input frequency bandwidth between a fixed mass and a mobile mass.

FIG. 8 is a graph showing a comparison of maximum output characteristics as a function of input frequency bandwidth between the fixed mass and the mobile mass.

As shown in FIG. 8, the fixed mass may only exhibit the maximum output at a specific frequency. That is, the fixed mass may be fixed to a position in which resonance occurs at a specific frequency, and when the frequency provided from the outside changes, resonance is impossible due to the fixed position. As opposed to this, the mobile mass 110 of the present disclosure may provide high output in a wide frequency range, not a fixed frequency. That is, according to the principle of continuous movement to the resonance position, the mobile mass 110 of the present disclosure may induce the piezoelectric beam 100 to generate displacement to the maximum and maximize the electricity production capacity of the piezoelectric energy harvester 10.

Accordingly, it is efficient in terms of energy, and due to having a wide operation frequency bandwidth, it may be utilized in any environment in which changing vibration is applied in real life, and it is possible to supply power to various types of sensors for implementing a smart factory in the future.

While the present disclosure has been hereinabove described with reference to the embodiments, the present disclosure should not be interpreted as being limited by these embodiments or the drawings, and it will be apparent to those skilled in the corresponding technical field that a variety of modifications and changes may be made thereto without departing from the spirit and scope of the present disclosure defined in the appended claims.

What is claimed is:

1. A self-resonance tuning piezoelectric energy harvester, comprising:
    a piezoelectric beam which extends along a horizontal direction;
    a fixing element which fixes two ends of the piezoelectric beam; and
    a mass which is connected to the piezoelectric beam movably along the piezoelectric beam,
    wherein the mass includes a through-hole through which the piezoelectric beam passes, and makes the movement through the through-hole.

2. The self-resonance tuning piezoelectric energy harvester according to claim 1, wherein the mass differs in resonance frequency depending on a position at which the mass is connected to the piezoelectric beam, and the mass moves to a position of the piezoelectric beam at which resonance will occur with an input frequency provided to the piezoelectric beam.

3. The self-resonance tuning piezoelectric energy harvester according to claim 2, wherein the through-hole further includes a clearance in addition to a space through which the piezoelectric beam passes.

4. The self-resonance tuning piezoelectric energy harvester according to claim 3, wherein as the mass moves to the position of the piezoelectric beam at which resonance will occur, displacement of the piezoelectric beam increases, and as the displacement is greater than the clearance, the mass is fixed to the position of the piezoelectric beam at which resonance will occur.

5. The self-resonance tuning piezoelectric energy harvester according to claim 1, wherein output characteristic measured in the piezoelectric beam over time appears in a form of a sine wave, and the sine wave includes an inflection point at a point where a positive output is maximum.

6. The self-resonance tuning piezoelectric energy harvester according to claim 1, wherein the piezoelectric beam includes a substrate, and a piezoelectric energy harvester unit element which receives a bending moment from the substrate, and the piezoelectric energy harvester unit element includes a first electrode, a piezoelectric material disposed on the first electrode, and a second electrode disposed on the piezoelectric material.

7. The self-resonance tuning piezoelectric energy harvester according to claim 6, wherein the piezoelectric material includes a piezoelectric single crystal of one selected from the group consisting of PZT, $Pb(Zn_{1/3}Nb_{2/3})O_3$—$PbTiO_3$ (PZN-PT), $[Pb(Mg_{1/3}Nb_{2/3})O_3]$—$[PbTiO_3]$ (PMN-PT), $(Na_xK_{1-x})NbO_3$ (NKN), $BaTiO_3$, ZnO, CdS and AlN, a piezoelectric mixture of at least one material selected from the group, including Macrofiber composite (MFC) and 2-2 composite, or a polymer piezoelectric material, including PVDF and PVDF-TrFE.

* * * * *